(12) United States Patent
Wiedmann et al.

(10) Patent No.: US 9,603,230 B2
(45) Date of Patent: Mar. 21, 2017

(54) SYSTEMS AND METHODS FOR MEASURING CURRENT WITH SHIELDED CONDUCTORS

(71) Applicant: General Electric Company, Schenectady, NY (US)

(72) Inventors: Uwe Wiedmann, Niskayuna, NY (US); George William Baptiste, Saint Saens (FR)

(73) Assignee: General Electric, Niskayuna, NY (US)

( * ) Notice: Subject to any disclaimer, the term of this patent is extended or adjusted under 35 U.S.C. 154(b) by 618 days.

(21) Appl. No.: 14/095,724

(22) Filed: Dec. 3, 2013

(65) Prior Publication Data

US 2015/0137795 A1    May 21, 2015

Related U.S. Application Data

(60) Provisional application No. 61/905,635, filed on Nov. 18, 2013.

(51) Int. Cl.
  *H05G 1/26* (2006.01)
  *G01R 19/00* (2006.01)
  *G01R 1/20* (2006.01)
(52) U.S. Cl.
  CPC ............ *H05G 1/265* (2013.01); *G01R 1/203* (2013.01); *G01R 19/0092* (2013.01)
(58) Field of Classification Search
  CPC .. H05G 1/34; H05G 1/46; H05G 1/32; H05G 1/10; H05G 1/30; H05G 1/265; H05G 1/26
  See application file for complete search history.

(56) References Cited

U.S. PATENT DOCUMENTS

| | | |
|---|---|---|
| 3,963,931 A | 6/1976 | Shapiro |
| 4,277,683 A | 7/1981 | Schmitmann |
| 4,768,215 A | 8/1988 | Kiwaki et al. |
| 5,008,913 A * | 4/1991 | Negle ............... G01R 1/18 174/351 |
| 5,333,169 A | 7/1994 | Koertge |
| 7,813,474 B2 | 10/2010 | Wu et al. |
| 2011/0142193 A1 | 6/2011 | Frontera et al. |

OTHER PUBLICATIONS

Behling, Rolf, et al. "P4-15: High Current X-Ray Source Technology for Medical Imaging." Philips Healthcare, pp. 475-476, 2010 IEEE, Hamburg, Germany.

* cited by examiner

*Primary Examiner* — Hoon Song
(74) *Attorney, Agent, or Firm* — Melissa K. Dobson

(57) ABSTRACT

Systems and methods for measuring current with shielded conductors are provided. One system includes a first wire within shielding, wherein the first wire is connected between a high voltage source and a filament of an x-ray system. The system also includes a second wire within shielding, wherein the second wire is connected between the high voltage source and the x-ray system and the shielding of the first and second wires is at a high voltage potential of the x-ray system. The system further includes a measurement resistor at a high voltage potential, wherein the measurement resistor is connected between the shielding and one of the first or second wires.

20 Claims, 7 Drawing Sheets

SYSTEMS AND METHODS FOR MEASURING CURRENT WITH SHIELDED CONDUCTORS

CROSS-REFERENCE TO RELATED APPLICATIONS

This application claims priority to and the benefit of the filing date of U.S. Provisional Application No. 61/905,635, filed on Nov. 18, 2013, entitled "Systems and Methods for Measuring Current with Shielded Conductors," which is hereby incorporated by reference in its entirety.

BACKGROUND

High voltage supplies may be used in different applications. In some of these applications, rapid changes to one or both of current and voltage may be needed. For example, x-ray tubes (having high voltage supplies) may be used in a variety of applications to scan objects and reconstruct one or more images of the object. In computed tomography (CT) imaging systems, an x-ray source, such as an x-ray tube, emits a fan-shaped beam or a cone-shaped beam toward a subject or an object, such as a patient or a piece of luggage, which is then detected by a detector array. In particular, in CT systems, the x-ray source and the detector array are rotated about a gantry within an imaging plane and around the subject.

Furthermore, the x-ray tube may include, for example, an emitter from which an electron beam is emitted toward a target. The emitter may be configured as a cathode and the target as an anode, with the target at a substantially higher positive voltage than the emitter. Electrons from the emitter may be formed into a beam and directed or focused by electrodes and/or magnets. In response to the electron beam impinging the target, the target emits x-rays. The emitter may contain a number of electrodes used to set the local electric field on the emitting structure.

The voltage supplied to the electrodes of the emitter may be controlled to adjust the intensity or energy of x-rays that are generated. In some of these systems, with respect to controlling the emitter, it is desirable to be able to produce fast transitions from low to high voltages, and vice versa, which may require fast current measurements.

Conventional control systems and methods, particularly that include arrangements for measuring the tube current, measure the cable charge current, which may be difficult or inconvenient to perform. Some systems use insulated measurement devices at the high-voltage potential, but do not have a shield at the high-voltage potential that connects to the x-ray tube. Other approaches add components to the x-ray tube that can add cost, complexity or failure modes.

BRIEF DESCRIPTION

In one embodiment, a measurement system is provided that includes a first wire within shielding, wherein the first wire is connected between a high voltage source and a filament of an x-ray system. The measurement system also includes a second wire within shielding, wherein the second wire is connected between the high voltage source and the x-ray system and the shielding of the first and second wires is at a high voltage potential of the x-ray system. The measurement system further includes a measurement resistor at a high voltage potential, wherein the measurement resistor is connected between the shielding and one of the first or second wires.

In another embodiment, a measurement system is provided that includes at least one wire connected to an electrode of an x-ray tube from which an electron beam is emitted, wherein the at least one wire is surrounded by shielding and the shielding is at a voltage level different from a ground level. The measurement system also includes a current measurement device connected between the at least one wire and the shielding.

In a further embodiment, an x-ray system is provided that includes a gantry and an x-ray tube mounted to the gantry, wherein the x-ray tube includes a filament. The x-ray system also includes a high voltage tank coupled to the x-ray tube, wherein the high voltage tank is configured to power the x-ray tube. The x-ray system further includes a detector mounted to the gantry opposite the x-ray tube assembly and a current measurement system including a first wire within shielding, wherein the first wire is connected between the high voltage tank and the filament of the x-ray tube and a second wire within shielding, wherein the second wire is connected between the high voltage tank and the x-ray tube. The current measurement system also includes a measurement resistor at a high voltage potential within the voltage tank, wherein the measurement resistor is connected between the shielding and one of the first or second wires.

DETAILED DESCRIPTION

Figure 1:
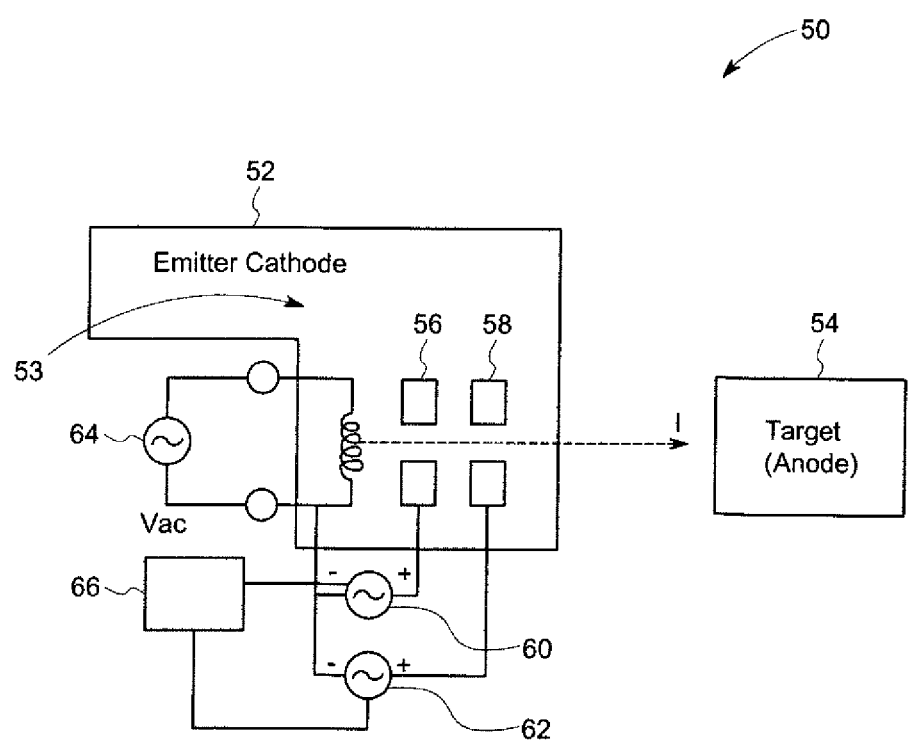
FIG. 1 is a simplified block diagram of an x-ray tube assembly in accordance with various embodiments.

Various embodiments will be better understood when read in conjunction with the appended drawings. To the extent that the figures illustrate diagrams of the functional blocks of various embodiments, the functional blocks are not necessarily indicative of the division between hardware circuitry. Thus, for example, one or more of the functional blocks (e.g., processors, controllers or memories) may be implemented in a single piece of hardware (e.g., a general purpose signal processor or random access memory, hard disk, or the like) or multiple pieces of hardware. Similarly, any programs may be stand-alone programs, may be incorporated as subroutines in an operating system, may be functions in an installed software package, and the like. It should be understood that the various embodiments are not limited to the arrangements and instrumentality shown in the drawings.

As used herein, an element or step recited in the singular and proceeded with the word "a" or "an" should be understood as not excluding plural of said elements or steps, unless such exclusion is explicitly stated. Furthermore, references to "one embodiment" are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

Methods and systems in accordance with various embodiments allow measurement of tube current accurately even when the tube voltage changes during the measurement. In particular, various embodiments measure the tube current by 1) having the tube current measurement performed at high voltage, and 2) having a shield at the high voltage potential around the wires that carry the tube current. By practicing various embodiments, the capacitive current between high voltage and ground flows on the shield and does not influence or minimally influences the tube current measurement.

In various embodiments, the current delivered to the filament wires of an x-ray tube may be measured while ensuring that no capacitive current flows (or reduce capacitive current) in the filament wires (e.g., wires supplying current to a filament of an x-ray tube). Thus, the tube current delivered to filament wires may be measured wherein a shielding is provided around the filament wires. In one embodiment, the shielding is connected to the same high voltage potential as the filament wires, but from a point before the tube current measurement. Accordingly, in various embodiments, the shielding is not connected to any filament wire on the x-ray tube side, but connected to all conducting pieces close to the filament wire.

In operation, in some embodiment, all or substantially all of the capacitive current between the high voltage potential and ground (or other conductors inside the high voltage cable) passes through the shielding connection. The filament wires are surrounded by the shielding at high voltage potential, and the capacitive current in the filament wires will be negligible, as the potential of the filament wires is very close to the high voltage potential. In some embodiments, the voltage difference is only due to a measurement resistor, which is dimensioned so that the voltage difference is less than, for example, 15V.

The measurements obtained using various embodiments may be used, for example, when controlling an electron beam (e.g., control of intensity and/or energy) generated by an x-ray tube assembly. It should be noted that although various embodiments may be described in connection with an x-ray tube assembly having a particular configuration, other configurations, geometries and arrangements are contemplated. For example, various embodiments control the voltages on different electrodes of the x-ray tube assembly, which in some embodiments, includes an extraction electrode and a focusing electrode. The voltage may be controlled independently for each and float at a high voltage.

FIG. 1 is a simplified block diagram of an x-ray tube assembly 50 formed in accordance with various embodiments. In the illustrated embodiment, the x-ray tube assembly includes an emitter cathode structure 52, which is the cathode and a target 54 that is the anode, both of which may be within a housing or casing of the x-ray tube assembly 50 as described in more detail herein. A voltage source 64 (which may be inside a high voltage tank) is provided in various embodiments that supplies a voltage to the emitter 53, which then may emit an electron beam as a result of being heated by the current supplied by the voltage source 64. It should be noted that different elements may be used instead of the voltage source 64, such as a current source or an indirectly heated emitter, among others. The electron beam may be directed towards the target 54 to produce x-rays, for example, by accelerating the electron beam from the emitter 53 towards the target 54 by applying a potential difference between the cathode structure 52 and the target 54. It should be noted that the target 54 may take different shapes and configurations as described in more detail herein.

The cathode structure 52 may also include an emitter focusing electrode 56, an extraction electrode 58, and optionally a downstream focusing electrode (not shown in FIG. 1). In the illustrated embodiments, the emitter focusing electrode 56 is disposed proximate the emitter 53 and the extraction electrode 58 is disposed downstream of the emitter focusing electrode 56 and the emitter 53, and the downstream focusing electrode (if provided) is disposed downstream of the extraction electrode 58, with the extraction electrode 58 thus interposed between the emitter focusing electrode 56 and the downstream focusing electrode 58. The electrodes may take different geometries or arrangements.

The voltage and current supplied to the emitter focusing electrode 56 and extraction electrode 58 are controlled in accordance with various embodiments. In various embodiments, the voltage and/or current supplied to the emitter focusing electrode 56 and extraction electrode 58 may be independently or separately controlled and allows for fast switching transitions. In the illustrated embodiment, a controller 66 is provided to control the voltage and/or current signals applied to the emitter focusing electrode 56 and/or extraction electrode 58 by the voltage sources 60 and 62. It should be noted that the voltage potential at the emitter focusing electrode 56 and extraction electrode 58 may be maintained or varied based on a desired operating characteristic or mode of operation for the x-ray tube assembly 50. It also should be noted that in various embodiments, the electronics and/or controls are located outside of the cathode structure 52.

Figure 2:
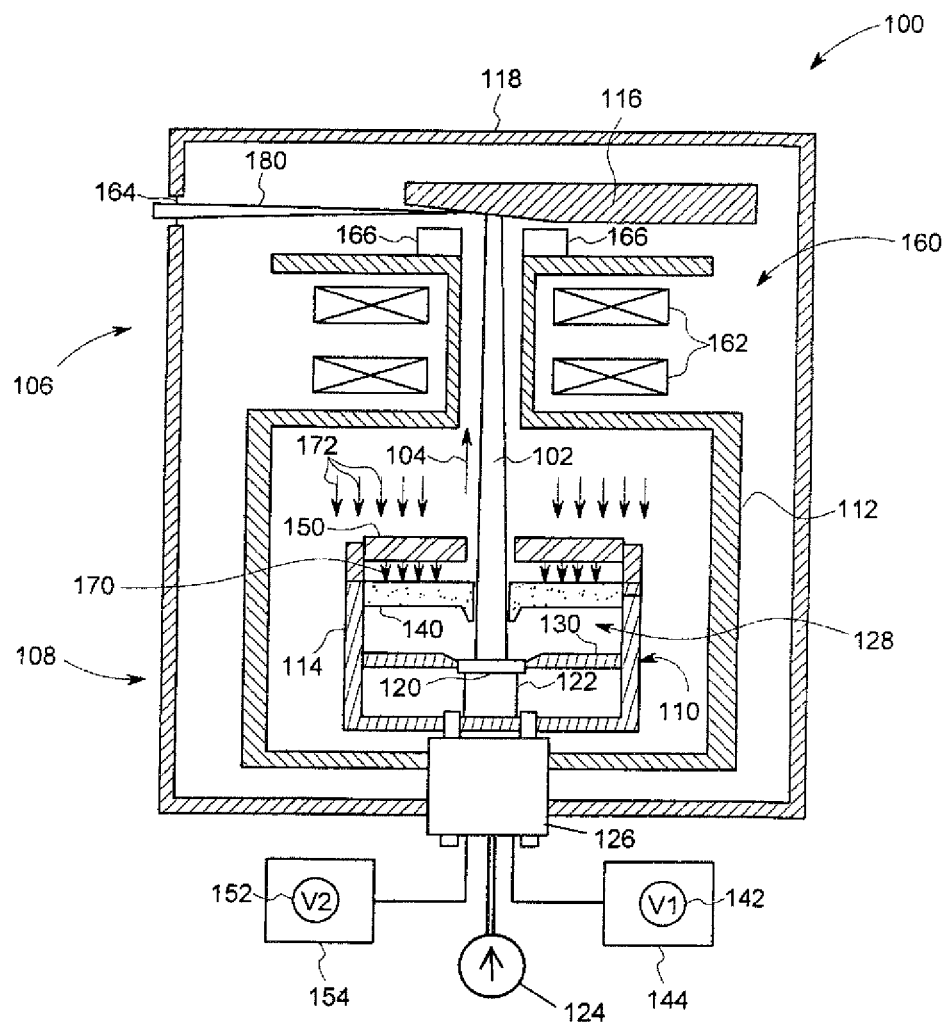
FIG. 2 is a sectional view of an x-ray tube assembly in accordance with various embodiments.

FIG. 2 is a sectional view of an x-ray tube assembly 100 formed in accordance with various embodiments. In one embodiment, the x-ray tube assembly 100 may be embodied as the x-ray tube assembly 50 shown in FIG. 1. However, in other embodiments, the x-ray tube assembly 100 is a different assembly. The x-ray tube assembly 100 includes an injector 110 (which includes an electron gun structure in the illustrated embodiment, but may be separate therefrom or a different emitter cathode structure) disposed within a wall 112 that is within a vacuum wall 118. The injector 110 may further include an injector wall 114 that encloses various components of the injector 110. In addition, the x-ray tube assembly 100 may also include an anode or target 116. The anode 116 is typically an x-ray target. The injector 110 and the target 116 are disposed within a tube insert 118 (which may be within a larger casing with oil circulating therebetween for cooling). In some embodiments, the injector 110 may include at least one cathode in the form of an emitter 120. In some embodiments, the injector 110 may include a Pierce-type cathode or Pierce-like cathode geometry. The cathode (e.g., emitter 120) may be directly heated in some embodiments, and indirectly heated in some embodiments, using filament wires as described in more detail herein. In the illustrated embodiments, the emitter 120 is coupled to an emitter support 122, with the emitter support 122 in turn coupled to the injector wall 114. The emitter 120 may be heated, for example, by passing a relatively large current through the emitter 120. A current source 124 may supply this current to the emitter 120. In some embodiments, a current of about 10 amps may be passed through the emitter 120. The emitter 120 may emit an electron beam 102 as a result of being heated by the current supplied by the current source 124 and by applying an accelerating electric field from the voltage between the extraction electrode 140 and the emitter 120. As used herein, the term "electron beam" may be used to refer to as a stream of electrons that have substantially similar velocities. The electron beam 102 defines a downstream direction 104 as the direction from the emitter 120 to the target 116. In various embodiments, the injector wall 114 may be at or close to the emitter potential and the wall 112 is at or close to the target potential. In various embodiments, when the wall 112 is at the same voltage as the target 116, the wall 112 may be referred to as the anode to differentiate the structure from the target 116.

The x-ray assembly 100 includes a downstream end 106 and an upstream end 108, with the emitter 120 disposed proximate the upstream end 108 and the target 116 disposed proximate the downstream end 106. The electron beam 102 may have a substantially uniform width, diameter, or cross-section along one or more portions of the length of the electron beam 102. In practice, other profiles may be employed. For example, the electron beam 102 may have a relatively small, substantially continuous taper along the length of the electron beam 102. As another example, the electron beam 102 may be tapered at different rates along different portions of the length of the electron beam. In some embodiments, one or more magnets 162 as described herein may be used to focus the electron beam 102.

The electron beam 102 may be directed towards the target 116 to produce x-rays 180. More particularly, the electron beam 102 may be accelerated from the emitter 120 towards the target 116 by applying a potential difference between the emitter 120 and the extraction electrode 140. In some embodiments, a high voltage in a range from about 40 kV to about 450 kV may be applied via use of a high voltage feedthrough 126 to set up a potential difference between the emitter 120 and the target 116, thereby generating a high voltage main electric field 172 to accelerate the electrons in the electron beam 102 towards the target 116. In some embodiments, a high voltage potential difference of about 140 kV may be applied between the emitter 120 and the target 116. It may be noted that in some embodiments, the target 116 may be at ground potential. For example, in some embodiments, the emitter 120 may be at a potential of about −140 kV and the target 116 may be at ground potential or about zero volts.

In alternative embodiments, the emitter 120 may be maintained at ground potential and the target 116 may be maintained at a positive potential with respect to the emitter 120. By way of example, the target 116 may be at a potential of about 140 kV and the emitter 120 may be at ground potential or about zero volts. In some embodiments, a bi-polar target and emitter arrangement may be employed. For example, the emitter 120 may be maintained at a negative potential, the target 116 may be maintained at a positive potential, and a frame to which the emitter 120 and target 116 are secured may be grounded.

When the electron beam 102 impinges upon the target 116, a large amount of heat may be generated in the target 116. The heat generated in the target 116 may be significant enough to melt the target 116. In some embodiments, a rotating target may be used to address the problem of heat generation in the target 116. For example, in some embodiments, the target 116 may be configured to rotate such that the electron beam 102 striking the target 116 does not cause the target 116 to melt since the electron beam 102 does not strike the target 116 substantially continuously at the same location. In some embodiments, the target 116 may include a stationary target. The target 116 may be made of a material that is capable of withstanding the heat generated by the impact of the electron beam 102. For example, the target 116 may include materials such as, but not limited to, tungsten, molybdenum, or copper. The target 116 may be, for example, either a reflection target (where the x-ray beam is essentially perpendicular to the incident electron beam 102), or a transmission target (where the x-ray beam is essentially in the same direction as the incident electron beam 102).

In the illustrated embodiment, the emitter 120 is a flat emitter. In alternative configurations the emitter 120 may be a curved emitter. The curved emitter, which is typically concave in curvature, provides pre-focusing of the electron beam. As used herein, the term "curved emitter" may be used to refer to an emitter that has a curved emission surface. Further, the term "flat emitter" may be used to refer to an emitter that has a flat emission surface. It may be noted that emitters of different shapes or sizes may be employed based on particular requirements for a given application.

In some embodiments, the emitter 120 may be formed from a low work-function material. More particularly, the emitter 120 may be formed from a material that has a high melting point and is capable of stable electron emission at high temperatures. The low work-function material may include materials such as, but not limited to, tungsten, thoriated tungsten, lanthanum hexaboride, hafnium carbide, or the like. In some embodiments, the emitter 120 may be provided with a coating of a low work-function material.

The injector 110 of the illustrated embodiments includes an electrode assembly 128 including an emitter focusing electrode 130 (which may be embodied as the emitter focusing electrode 56 of FIG. 1), an extraction electrode 140 (which may be embodied as the extraction electrode 58 of FIG. 1), and optionally a downstream focusing electrode 150. In the illustrated embodiments, the emitter focusing electrode 130 is disposed proximate the emitter 120, the extraction electrode 140 is disposed downstream of the emitter focusing electrode 130 and the emitter 120, and the downstream focusing electrode 150 is disposed downstream of the extraction electrode 140, with the extraction electrode 140 thus interposed between the emitter focusing electrode 130 and the downstream focusing electrode 150. The electrode assembly 128, or portions thereof, may be mounted to and/or enclosed by the injector wall 114. The particular geometries or arrangements of electrodes depicted in FIG. 2 are provided by way of example for simplicity and clarity of illustration and may differ in various embodiments. For example, one or more of the electrodes (e.g., the downstream focusing electrode) may have a larger outer diameter than other electrodes (e.g., the emitter focusing electrode and/or extraction electrode) and/or be mounted to an alternative wall or structure than injector wall 114. Also, one or more of the electrodes (e.g., the downstream focusing electrode) may have a greater length along an axis defined by the electron beam than other electrodes (e.g., the emitter focusing electrode and/or extraction electrode). Further, one or more of the electrodes may have a tapered bore, for example, a bore having a larger inner diameter at a downstream end and a smaller inner diameter at an upstream end.

The emitter focusing electrode 130 is disposed proximate to the emitter 120. In the illustrated embodiment, the emitter focusing electrode 130 is positioned such that at least a portion of the emitter focusing electrode 130 overlaps at least a portion of the emitter 120 in the downstream direction 104, with the portion of the emitter focusing electrode 130 that overlaps the emitter 120 disposed axially outward (with the electron beam 102 defining the axis) from the emitter 120 and surrounding the emitter 120 in the axial direction. In some embodiments, the emitter focusing electrode 130 may be disposed immediately downstream of the emitter 120 (e.g., not overlapping in the downstream direction, but either abutting or having a very small gap between the emitter 120 and the emitter focusing electrode 130 in the downstream direction 104). In some embodiments, the emitter focusing electrode is formed as a substantially continuous annular member (e.g., a ring).

In some embodiments, the emitter focusing electrode 130 may be maintained at a voltage potential that is less than a voltage potential of the emitter 120. The potential difference between the emitter 120 and the emitter focusing electrode 130 inhibits the movement of electrons generated from the emitter 120 from moving towards the emitter focusing electrode 130. For example, the emitter focusing electrode 130 may be maintained at a negative potential with respect to that of the emitter 120, with the negative potential with respect to the emitter 120 acting to focus the electron beam 102 away from the emitter focusing electrode 130, thereby facilitating focusing the electron beam 102 towards the target 116.

In some embodiments, the emitter focusing electrode 130 may be maintained at a voltage potential that is equal to or substantially similar to the voltage potential of the emitter 120. The similar voltage potential of the emitter focusing electrode 130 with respect to the voltage potential of the emitter 120 helps generate a substantially parallel electron beam by shaping electrostatic fields due to the shape of the emitter focusing electrode 130. The emitter focusing electrode 130 may be maintained at a voltage potential that is equal to or substantially similar to the voltage potential of the emitter 120 via use of a lead (not shown in FIG. 2) that couples the emitter 120 and the emitter focusing electrode 130. Additionally or alternatively, the voltage potential of the emitter focusing electrode 130 may be adjustable between a potential substantially similar to the potential of the emitter 120 and a negative potential with respect to the potential of the emitter 120.

The electrode assembly 128 of the injector 110 further includes an extraction electrode 140 disposed proximate to and downstream of the emitter focusing electrode 130. The extraction electrode 140 is also disposed downstream of the emitter 120 and upstream with respect to the target 116, and is configured to additionally shape, control, and/or focus the electron beam 102 and an intensity thereof. In the illustrated embodiment, the extraction electrode 140 is formed as generally continuous ring shaped member disposed axially outwardly of the emitter 120 and the electron beam 102. In alternate embodiments, other shapes may be employed for the extraction electrode 140 (e.g., elliptical, polygonal, or the like).

In some embodiments, the extraction electrode 140 may be negatively biased with respect to the emitter 120. For example, a bias voltage power supply 142 may supply a voltage to the extraction electrode 140 (e.g., through the high voltage feedthrough 126) such that the extraction electrode 140 is maintained at a negative bias voltage with respect to the emitter 120. In some embodiments, the negative bias voltage may be variable. For example, the negative bias voltage may be variable between a maximum amplitude of negative bias voltage and a minimum amplitude of negative bias voltage. The minimum amplitude of negative bias voltage, in some embodiments, may be about zero volts of bias with respect to the voltage of the emitter 120. The bias voltage of the extraction electrode 140 may be adjusted via a control electronics module 144, which may control the bias voltage responsive to an operator input from, for example, an operator console.

Further, in some embodiments, the extraction electrode 140 may also be selectably positively biased with respect to the emitter 120. For example, the bias voltage power supply 142 may supply a voltage to the extraction electrode 140 such that the extraction electrode 140 is maintained at a positive bias voltage with respect to the emitter 120. The electrode assembly 128 may be configured so that an operator may selectably switch between a positive bias voltage and a negative bias voltage for the extraction electrode 140 (such as controlled by the controller 66 shown in FIG. 1). For example, a number of pre-set voltages may be selectable between a maximum negative bias voltage and a maximum positive voltage bias, or, as another example, the bias voltage may be substantially continuously adjustable between the maximum negative bias voltage and the maximum positive voltage bias (e.g., via use of a dial, slider, or the like on a control panel or operator console).

The electrode assembly 128 of the injector 110 further optionally includes a downstream focusing electrode 150 disposed proximate to and downstream of the extraction electrode 140. In the illustrated embodiment, one downstream focusing electrode 150 is shown. In some embodiments, additional downstream focusing electrodes may be employed. The downstream focusing electrode 150 is thus also disposed downstream of the emitter 120 and upstream with respect to the target 116, and is configured to additionally shape, control, and/or focus the electron beam 102, for example, as described in co-pending application Ser. No. 13/718,672, entitled "X-ray Tube With Adjustable Electron Beam", which is commonly owned.

In the illustrated embodiment, the downstream focusing electrode 150 is formed as generally continuous ring shaped member disposed axially outwardly of the emitter 120 and the electron beam 102. In alternate embodiments, other shapes may be employed for the downstream focusing electrode 150 (e.g., elliptical, polygonal, or the like).

The downstream focusing electrode 150 may be positively biased with respect to the emitter 120. It should be noted that in some embodiments the downstream focusing electrode 150 may additionally be configured to aid in extraction of the electron beam and thus may also be understood as or referred to as a downstream extraction electrode. For example, a bias voltage power supply 152 may supply a voltage to the downstream focusing electrode 150 (e.g., through the high voltage feedthrough 126) such that the extraction electrode 140 is maintained at a positive bias voltage with respect to the emitter 120. In some embodiments, the positive bias voltage may be variable. For example, the positive bias voltage may be variable between a maximum amplitude of positive bias voltage and a minimum amplitude of positive bias voltage. The bias voltage of the downstream focusing electrode 150 may be adjusted via a control electronics module 154 (which may be embodied as the controlled 66 shown in FIG. 1), which may control the bias voltage responsive to an operator input from, for example, an operator console. For example, a number of pre-set voltages may be selectable between the maximum positive bias voltage and the minimum positive voltage bias, or, as another example, the bias voltage may be substantially continuously adjustable between the maximum positive bias voltage and the minimum positive voltage bias (e.g., via use of a dial, slider, or the like on a control panel or operator console).

The x-ray tube assembly 100 illustrated in FIG. 2 also includes means for focusing and/or positioning and deflecting the electron beam 102 on the target 116. In some embodiments, this is provided with a magnetic assembly 160 that may be disposed between the injector 110 and the target 116 (e.g. downstream of the extraction electrode 140, downstream of the downstream focusing electrode 150, and upstream of the target 116). However, it should be appreciated that other means may be provided or used, such as non-magnetic means, for example, using electro-static focusing and/or electro-static electron beam deflection. In the illustrated embodiment, the magnetic assembly 160 includes magnets 162 for influencing focusing of the electron beam 102 by creating a magnetic field that shapes the electron beam 102 on the target 116. The magnets 162 may include one or more quadrupole magnets, one or more dipole magnets, or combinations thereof. As the properties of the electron beam current and voltage may change rapidly, the effect of space charge and electrostatic focusing in the injector 110 will change accordingly. To help maintain a stable focal spot size, or quickly modify focal spot size according to system requirements, the magnetic assembly 160 provides a magnetic field having a performance controllable from steady-state to a sub-30 microsecond time scale for a wide range of focal spot sizes. In some embodiments, the magnetic assembly 160 may be configured to provide a magnetic field having a performance controllable from steady-state to a sub-10 microsecond time scale. This helps provide protection of the x-ray source system, as well as achieving CT system performance requirements.

Further, in some embodiments, the magnetic assembly 160 may include one or more dipole magnets for deflection and positioning of the electron beam 102 at a desired location on the x-ray target 116. The electron beam 102 that has been focused and positioned impinges upon the target 116 to generate the x-rays 180. The x-rays 180 generated by collision of the electron beam 102 with the target 116 may be directed from the x-ray tube 180 through an opening in the tube casing 118, which may be generally referred to as an x-ray window 164, towards an object (not shown in FIG. 2).

Various combinations of bias voltages and currents among the electrodes of the electrode assembly 128 and/or magnet voltage or current settings may be employed to control the electron beam 102, for example, control the shape and/or intensity distribution of the electron beam 102. In particular, different circuits may be used to form a control arrangement to allow switching at different speeds.

Figure 3:
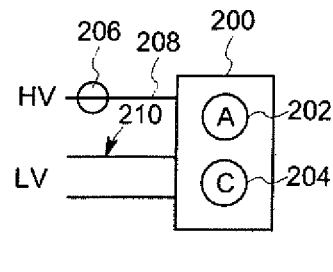
FIGS. 3-8 are block diagrams illustrating different connection arrangements in accordance with various embodiments.
Figure 4:
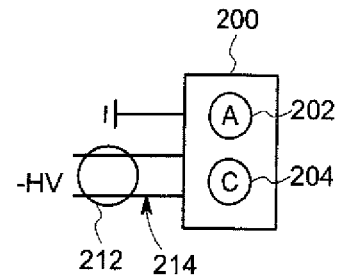
Figure 5:
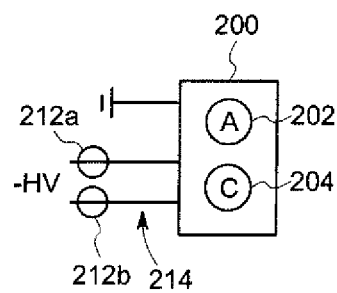
Figure 6:
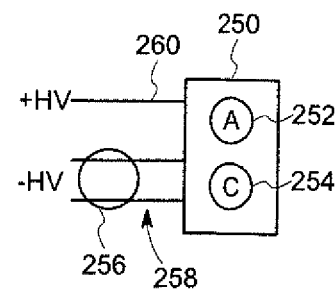
Figure 7:
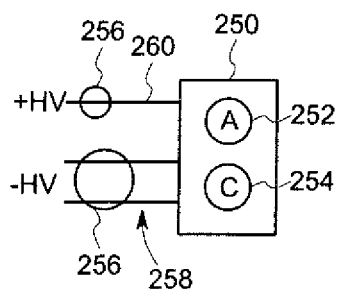
Figure 8:
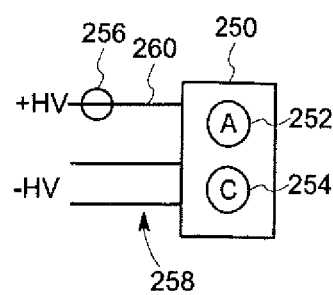

Various embodiments may be used with an x-ray tube 200 in a mono-polar configuration (mono-polar x-ray tube) as shown in FIGS. 3-5 or with an x-ray tube 250 in a bi-polar configuration (bi-polar x-ray tube) as shown in FIGS. 6-8. In particular, the x-ray tube 200 includes an anode 202 (which may be embodied as the anode 116 shown in FIG. 2) and a cathode 204 (which may be embodied as emitter 120 shown in FIG. 2). Similarly, the x-ray tube 250 includes an anode 252 (which may be embodied as the anode 116 shown in FIG. 2) and a cathode 254 (which may be embodied as emitter 120 shown in FIG. 2).

Various embodiments provide shielded wires that are configured and/or arranged to keep or maintain the shield at a potential that is close to the potential of the wire the shield surrounds. In various embodiments, for safety reasons, the high-voltage cable includes an additional outer shielding at ground level. It should be noted that filament wires as used in various embodiments refers to wires or conductors connected to one or more of the filaments of an x-ray tube. For example, as shown in FIG. 3, shielding 206 is provided around the single high voltage wire 208 connected to the anode 202 and not around the low voltage wires 210 connected to the cathode. In the embodiment of FIG. 4, shielding 212 is provided around high voltage filament wires 214 connected to the cathode 204 with the anode 202 connected to ground. In the embodiment of FIG. 5, a separate shielding 212a and 212b is provided around each of the high voltage filament wires 214 connected to the cathode 204 with the anode 202 connected to ground. It should be noted that in various embodiments of FIG. 5, the two individual shieldings 212a and 212b are electrically connected together.

In the embodiment of FIG. 6, shielding 256 is provided around negative high voltage filament wires 258 (−HV) connected to the cathode 254 with the anode 252 connected to a single positive high voltage wire 260 (+HV). In the embodiment of FIG. 7, shielding 256 is provided around negative high voltage filament wires 258 (−HV) connected to the cathode 254 and around a single positive high voltage wire 260 (+HV) connected to the anode 252. In the embodiment of FIG. 8, shielding 256 is provided around the single positive high voltage wire 260 (+HV) connected to the anode 252 and the negative high voltage filament wires 258 (−HV) are connected to the cathode 254. Thus, it should be appreciated that shielding 256 may be provided in different configurations of x-ray tubes and filament wires. It should be appreciated that in embodiments having a field emitter cathode or other type of cathode having only one wire connected to the cathode, shielding the single wire provides the same benefit as shielding the two filament wires in the case of a cathode with a filament that uses two wires. It should be noted that as used in various embodiment, reference to low voltage (LV) means that the potential on both wires is always close to ground, wherein one of the wires may be at ground level (0 V).

Figure 9:
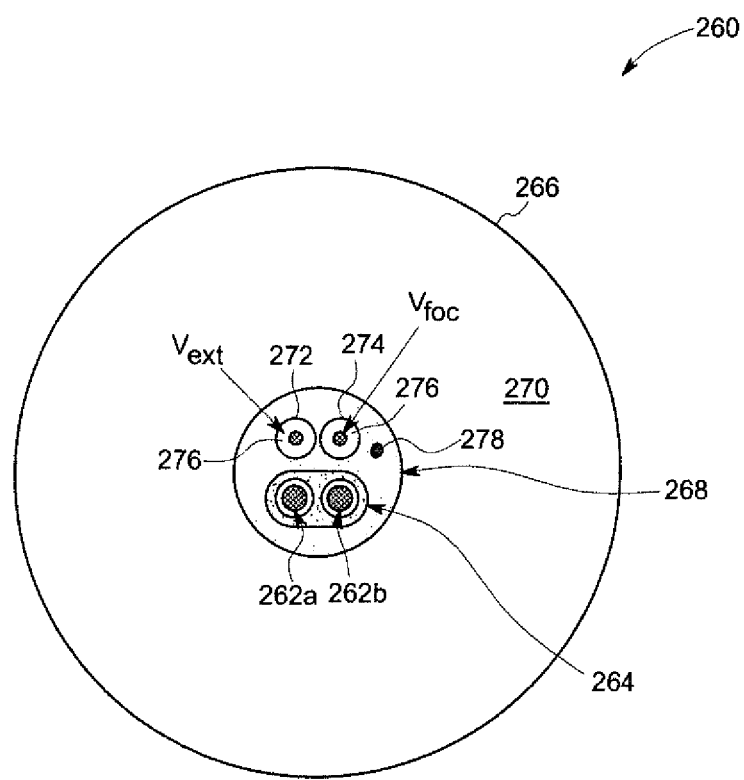
FIG. 9 is a diagram illustrating a shielding arrangement in accordance with an embodiment.

One embodiment of a shielding arrangement 260 is shown in FIG. 9. As can be seen, a pair of filament wires 262 (which may be embodied as the wires 214 shown in FIG. 4 or the wires 258 shown in FIGS. 6 and 7) are surrounded by shielding 264 at the high voltage potential. It should be noted that the shielding 264 may be constructed of suitable shielding material, for example, as known in the art. In some embodiments, the material of the shielding 264 may be slightly conductive to equalize the high voltage (HV) field. The shielding 264 acts to protect the filament wires 262 from a capacitive effect within an outer shielding 266 (at ground). The outer shielding 266 may be, for example, a protective jacket as known in the art. The shielded filament wires 262 may also be surrounded by optional shielding 268 at the high voltage potential. The shielding 268 may be constructed and provided similar to the shielding 264.

In the illustrated embodiment, additional wires are also provided within the shielding 266 and surrounded by insulating material 270 (e.g., a dielectric insulator). For example, in the illustrated embodiment, high voltage wires 272 and 274 are within the shielding 266 (and also within the optional shielding 268). For example, the high voltage wires 272 and 274 may provide voltages Vext and Vfoc to the extraction electrode 140 and/or the emitter focusing electrode 130 (shown in FIG. 2), respectively. It should be noted that the high voltage wires 272 and 274 include an insulating material 276 and do not have to include additional shielding. Thus, it should be appreciated that all of the conductors of the wires within the shielding 266 are electrically insulated.

Additional wires within the shielding 266 may be provided. For example, a common wire 278 may be provided within the shielding 266 and shown within the optional shielding 268. It should be noted that the common wire 278 also may be provided by a conductor that is smaller in size than conventional common wires.

It also should be noted that the shielding 264 may be provided individually around each of the filament wires 262 with the shieldings of both wires 262 connected together at one or more points of the cable. Using the shielding arrangement 260, current delivered to the filament wires 262 may be measured without (or with reduced) capacitive current flowing in the filament wires 262. Thus, shielding, in particular the shielding 264 is provided at the high voltage to distribute the high voltage and reduce or eliminate the part of the capacitive current flowing through the filament wires 262 and to a measurement resistor (described in more detail herein). Thus, an accurate (or real) tube current may be measured as described in more detail herein in various embodiments.

In particular, in various embodiments, the pair of filament wires 262 provides a new current flow return path (e.g., though one of the filament wires 262). For example, the first shielded filament wire 262a may be connected to an x-ray tube and the second shielded filament wire 262b may provide a return path for current flow and in some embodiments is connected to the x-ray tube as shown in FIGS. 3-8. In some embodiments, the first shielded filament wire 262a may provide current flow in a first direction and the second shielded filament wire 262b may provide current flow in a second direction, such as opposite the first direction. However, different configurations and current flow may be provided. In some embodiments, a single wire 262 may be provided and connected to an electrode of the x-ray tube from which the electron beam is emitted.

As described in more detail below, a measurement device, for example, a current measurement device such as a resistor, inductive member, or Hall sensor is provided to allow measurement of the current delivered to the filament wires of the x-ray tube. For example, in some embodiments the measurement resistor is at the high voltage potential and connected between the shielding 264 and the filament wires 262. Thus, the potential of the shielding 264 is close to the potential of the filament wires 262 (and reduces or prevents the capacitive effect within the filament wires 262 to allow current measurement at the high voltage side). The shielding 264 in various embodiments is at the high voltage potential and extends from a high voltage tank to a high voltage cable, and also may extend into the x-ray tube.

Figure 10:
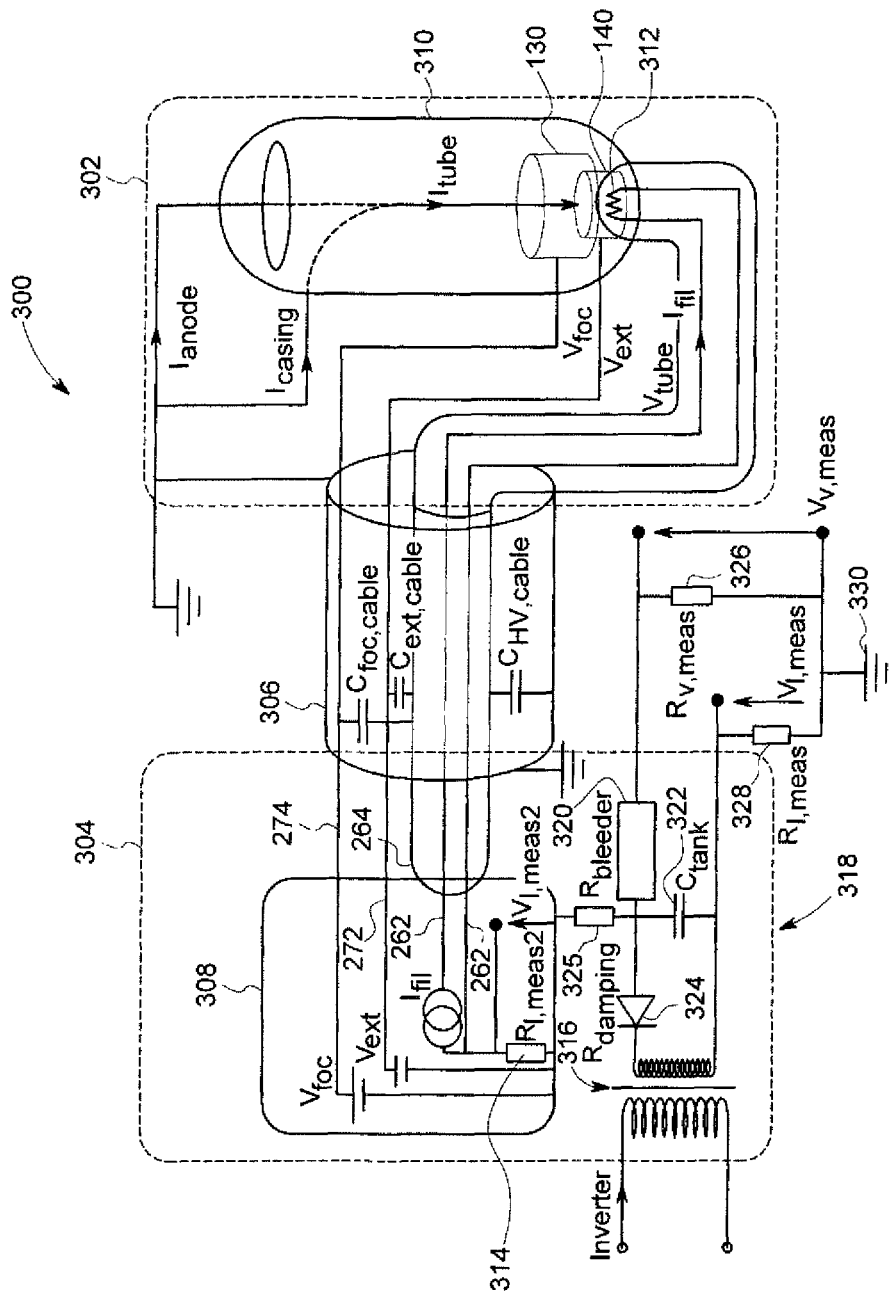
FIG. 10 is a schematic block diagram illustrating an x-ray system in accordance with an embodiment having shielded filament cables.

For example, FIG. 10 illustrates one connection arrangement for an x-ray tube application. It should be noted that the connection arrangement is illustrated for a mono-polar configuration. However, as described herein, the various embodiments may be implemented with a bi-polar configuration, as well as different mono-polar configurations.

In particular, an x-ray system 300 includes an x-ray tube 302 (which may be embodied as the x-ray tube assembly 100 shown in FIG. 2) coupled to a high voltage source illustrated as a high voltage tank 304 via a high voltage cable 306. It should be noted that like numerals represent like parts in the figures. As can be seen, the shielding 264 surrounds the filament wires 262 from the connection to a faraday cage 308 within the high voltage tank 304 and into the x-ray tube 302, which in this embodiment is into the vacuum tube 310 and connected to the filament 312 (forming the cathode of the x-ray tube 302).

In the illustrated embodiment, a measurement resistor ($R_{I,meas2}$)314 is connected at the high voltage potential (i.e., within the high voltage tank 304) between the shielding 264 and the filament wires 262 to allow measurement of the current ($I_{meas2}$) flowing through the filament wires 262 (without or with reduced capacitive current flow as described herein). This current is equal to the voltage drop measured between the point indicated with $I_{meas2}$ and the faraday cage 308, divided by the value of the resistor $R_{I,meas2}$.

In operation, in various embodiments, all or most of the capacitive current between the high voltage potential and ground (or other conductors inside the high-voltage cable) passes through the shielding connection. The filament wires 262 are surrounded by the shielding 264 at high voltage potential, and the capacitive current in the filament wires 262 will be negligible, as the potential of the filament wires 262 is very close to the high voltage potential. Thus, in some embodiments, the voltage difference is only due to a measurement resistor 314, which is dimensioned so that the voltage difference is less than, for example, 15V.

The high voltage tank 304 also includes a transformer 316 connecting an inverter to a voltage/current measurement arrangement 318 to measure the voltage/current of the x-ray tube 302. Additionally, a resistor 326 is connected between the bleeder resistor 320 and ground 330, and a resistor 328 is connected to the high-voltage transformer 316. The resistors 326 ($R_{V,meas}$) and 328 ($R_{I,meas}$) allow measurement of the voltage/current of the x-ray tube 302, but resistor 328 measures the entire current (which includes the capacitive current). A damping resistor 330 ($R_{damping}$) is also provided and connected to the faraday cage 308. Thus, the measurement arrangement 318 includes the resistors 320 and 326 to perform voltage measurements and the resistor 328 to perform current measurements (current is equal to the voltage drop on the resistor 314 ($R_{I,meas2}$), divided by the value of the resistor $R_{I,meas2}$).

A bleeder resistor 320 and capacitor 322 are also connected with a diode 324 to one end of the transformer 316 to form part of a rectifying circuit to generate the high voltage.

Figure 11:
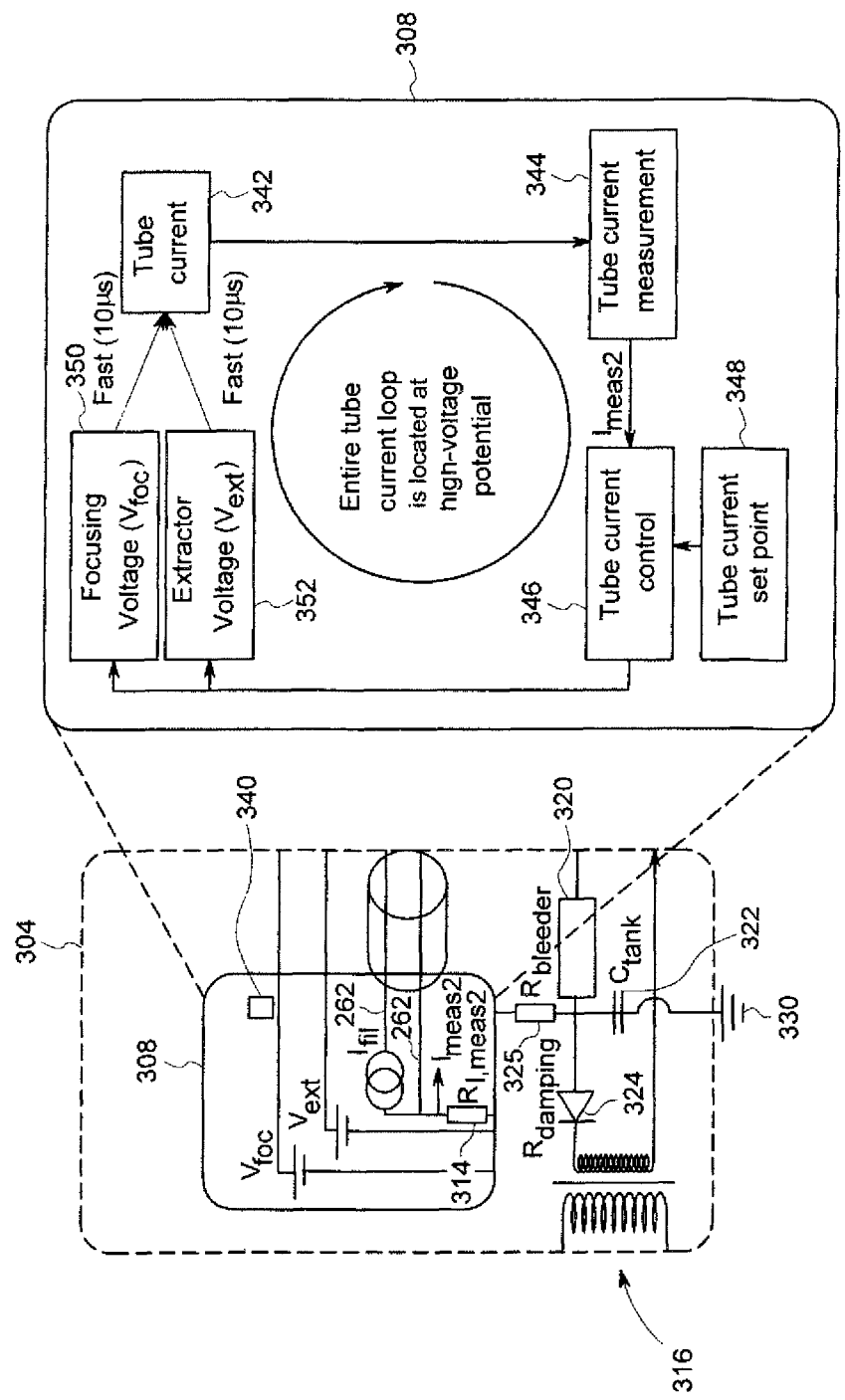
FIG. 11 is a diagram illustrating current measurements in accordance with various embodiments.

FIG. 11 illustrates tube current measurements, in particular, measurements of the current delivered to the filament wires 262 in accordance with various embodiments. As described herein, the entire tube current loop is located at high voltage potential (illustrated by the arrow). For example, the tube current 342 may be measured as described herein such that a tube current measurement 344 ($I_{meas2}$) may be provided to a tube current controller 346 to control the tube current (and voltage switching as described herein), which may be set based on a tube current set point 348. In some embodiments, the current measurements, such as of the focusing voltage 350 and the extractor voltage 352 may be measured rapidly (e.g., 10μ seconds). It should be noted that a controller 340 (e.g., a microprocessor) may be provided within the faraday cage 308 on the high voltage side instead of sending to the low voltage side.

Thus, in various embodiments, accurate tube current measurement may be performed, which includes measuring the tube current in the high voltage tank 304. The tube current may be measured at the ground level in some embodiments that is accurate with tube voltage measurements to provide fast measurements or that eliminates or reduces high voltage cable capacitance. The tube current may be measured at the high voltage levels wherein the capacitance to ground is eliminated or reduced with the filament wires 262 shielded.

Figure 12:
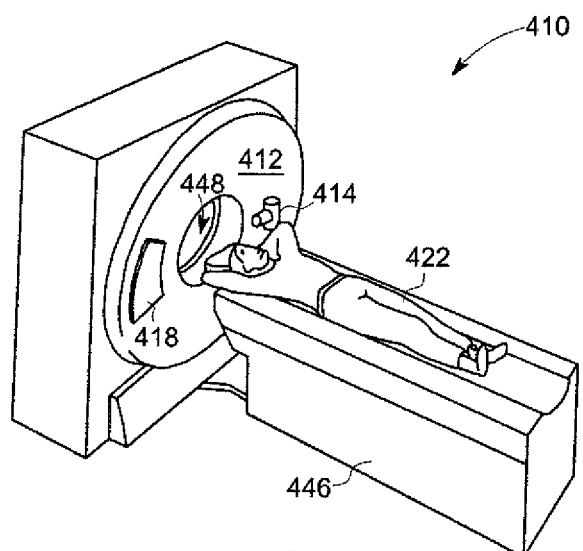
FIG. 12 is a pictorial view of a computed tomography (CT) imaging system in accordance with various embodiments.
Figure 13:
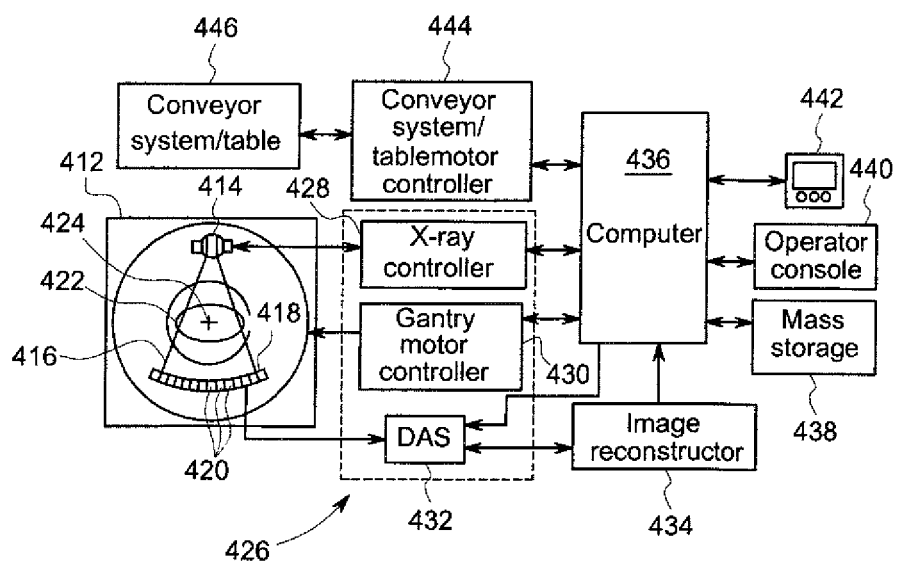
FIG. 13 is a block schematic diagram of the CT imaging system of FIG. 12 in accordance with various embodiments.

Various embodiments may be used to provide voltage control in different applications, for example, for an x-ray assembly, such as the x-ray tube assembly 100, which may be used in conjunction with a computed tomography (CT) system. FIG. 12 provides a pictorial view of a computed tomography (CT) imaging system 410 in accordance with an embodiment, and FIG. 13 provides a block schematic diagram of the CT imaging system 410 of FIG. 12 in accordance with various embodiments. The CT imaging system 410 includes a gantry 412. The gantry 412 has an x-ray source 414 configured to project a beam of x-rays 416 toward a detector array 418 positioned opposite the x-ray source 414 on the gantry 412. The x-ray source 414 may include an x-ray tube assembly such as the x-ray tube assembly 100. In some embodiments, the gantry 412 may have multiple x-ray sources (e.g., along a patient theta or patient Z axis) that project beams of x-rays. The detector array 418 is formed by a plurality of detectors 420 which together sense the projected x-rays that pass through an object to be imaged, such as a medical patient 422. During a scan to acquire x-ray projection data, the gantry 412 and the components mounted thereon rotate about a center of rotation 424. While the CT imaging system 410 is described in connection with FIG. 12 with reference to the medical patient 422, it should be noted that the CT imaging system 410 may have applications outside of the medical realm. For example, the CT imaging system 410 may be utilized for ascertaining the contents of closed articles, such as luggage, packages, etc., and in search of contraband such as explosives and/or bio-hazardous materials.

Rotation of the gantry 412 and the operation of the x-ray source 414 are governed by a control mechanism 426 of the CT system 410. The control mechanism 426 includes an x-ray controller 428 that provides power and timing signals to the x-ray source 414 (which may include generating control signals in accordance with various embodiments based on filament current measurements) and a gantry motor controller 430 that controls the rotational speed and position of the gantry 412. A data acquisition system (DAS) 432 in the control mechanism 426 samples analog data from the detectors 420 and converts the data to digital signals for subsequent processing. An image reconstructor 434 receives sampled and digitized x-ray data from the DAS 432 and performs high-speed reconstruction. The reconstructed image is applied as an input to a computer 436, which stores the image in a mass storage device 438.

Moreover, the computer 436 may also receive commands and scanning parameters from an operator via operator console 440 that may have an input device such as a keyboard (not shown in FIGS. 12 and 13). An associated display 442 allows the operator to observe the reconstructed image and other data from the computer 436. Commands and parameters supplied by the operator or as describe herein are used by the computer 436 to provide control and signal information to the DAS 432, the x-ray controller 428, and the gantry motor controller 430.

Additionally, the computer 436 may operate a table motor controller 444, which controls a motorized table 446 to position the patient 422 and/or the gantry 412. For example, the table 546 may move portions of the patient 422 through a gantry opening 548. It may be noted that in certain embodiments, the computer 436 may operate a conveyor system controller 444, which controls a conveyor system 446 to position an object, such as baggage or luggage, and the gantry 412. For example, the conveyor system 446 may move the object through the gantry opening 448.

It should be noted that the various embodiments may be implemented in hardware, software or a combination thereof. The various embodiments and/or components, for example, the modules, or components and controllers therein, also may be implemented as part of one or more computers or processors. The computer or processor may include a computing device, an input device, a display unit and an interface, for example, for accessing the Internet. The computer or processor may include a microprocessor. The microprocessor may be connected to a communication bus. The computer or processor may also include a memory. The memory may include Random Access Memory (RAM) and Read Only Memory (ROM). The computer or processor further may include a storage device, which may be a hard disk drive or a removable storage drive such as a floppy disk drive, optical disk drive, and the like. The storage device may also be other similar means for loading computer programs or other instructions into the computer or processor.

As used herein, the term "computer" or "module" may include any processor-based or microprocessor-based system including systems using microcontrollers, reduced instruction set computers (RISC), ASICs, logic circuits, and any other circuit or processor capable of executing the functions described herein. The above examples are exemplary only, and are thus not intended to limit in any way the definition and/or meaning of the term "computer."

As used herein, the terms "system," "unit," or "module" may include a hardware and/or software system that operates to perform one or more functions. For example, a module, unit, or system may include a computer processor, controller, or other logic-based device that performs operations based on instructions stored on a tangible and non-transitory computer readable storage medium, such as a computer memory. Alternatively, a module, unit, or system may include a hard-wired device that performs operations based on hard-wired logic of the device. The modules or units shown in the attached figures may represent the hardware that operates based on software or hardwired instructions, the software that directs hardware to perform the operations, or a combination thereof.

The block diagrams of embodiments herein illustrate various blocks labeled "module." It is to be understood that the modules represent circuit modules that may be implemented as hardware with associated instructions (e.g., software stored on a tangible and non-transitory computer readable storage medium, such as a computer hard drive, ROM, RAM, or the like) that perform the operations described herein. The hardware may include state machine circuitry hard wired to perform the functions described herein. Optionally, the hardware may include electronic circuits that include and/or are connected to one or more logic-based devices, such as microprocessors, processors, controllers, or the like. Optionally, the modules may represent processing circuitry such as one or more field programmable gate array (FPGA), application specific integrated circuit (ASIC), or microprocessor. The circuit modules in various embodiments may be configured to execute one or more algorithms to perform functions described herein. The one or more algorithms may include aspects of embodiments disclosed herein, whether or not expressly identified in a flowchart or a method.

The computer or processor executes a set of instructions that are stored in one or more storage elements, in order to process input data. The storage elements may also store data or other information as desired or needed. The storage element may be in the form of an information source or a physical memory element within a processing machine.

The set of instructions may include various commands that instruct the computer or processor as a processing machine to perform specific operations such as the methods and processes of the various embodiments. The set of instructions may be in the form of a software program. The software may be in various forms such as system software or application software and which may be embodied as a tangible and non-transitory computer readable medium. Further, the software may be in the form of a collection of separate programs or modules, a program module within a larger program or a portion of a program module. The software also may include modular programming in the form of object-oriented programming. The processing of input data by the processing machine may be in response to operator commands, or in response to results of previous processing, or in response to a request made by another processing machine.

As used herein, the terms "software" and "firmware" are interchangeable, and include any computer program stored in memory for execution by a computer, including RAM memory, ROM memory, EPROM memory, EEPROM memory, and non-volatile RAM (NVRAM) memory. The above memory types are exemplary only, and are thus not limiting as to the types of memory usable for storage of a computer program.

As used herein, an element or step recited in the singular and proceeded with the word "a" or "an" should be understood as not excluding plural of said elements or steps, unless such exclusion is explicitly stated. Furthermore, references to "one embodiment" are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments without departing from the scope thereof. While the dimensions and types of materials described herein are intended to define the parameters of the various embodiments, the embodiments are by no means limiting and are exemplary embodiments. Many other embodiments will be apparent to those of skill in the art upon reviewing the above description. The scope of the various embodiments should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

This written description uses examples to disclose the various embodiments, including the best mode, and also to enable any person skilled in the art to practice the various embodiments, including making and using any devices or systems and performing any incorporated methods. The patentable scope of the various embodiments is defined by the claims, and may include other examples that occur to those skilled in the art. Such other examples are intended to be within the scope of the claims if the examples have structural elements that do not differ from the literal language of the claims, or if the examples include equivalent structural elements with insubstantial differences from the literal languages of the claims.

What is claimed is:

1. A measurement system comprising:
   a first wire within shielding, the first wire connected between a high voltage source and a filament of an x-ray system;
   a second wire within shielding, the second wire connected between the high voltage source and the x-ray system, wherein the shielding of the first and second wires is at a high voltage potential of the x-ray system;
   a measurement resistor having at least one end at the high voltage potential, the measurement resistor connected between the shielding and one of the first or second wires; and
   additional shielding surrounding the shielding of the first and second wires.

2. The measurement system of claim 1, wherein the high voltage potential is defined by a voltage level of the high voltage source, wherein the voltage level is at least 40 kV.

3. The measurement system of claim 1, wherein the shielding extends into an x-ray tube of the x-ray system.

4. The measurement system of claim 1, wherein the shielding comprises a single shielding member surrounding the first and second wires.

5. The measurement system of claim 1, wherein the shielding comprises a separate shielding member surrounding each of the first and second wires.

6. The measurement system of claim 1, wherein the additional shielding is at the high voltage potential.

7. The measurement system of claim 1, wherein the additional shielding is at ground.

8. The measurement system of claim 7, further comprising at least one additional wire within the additional shielding and at the high voltage potential.

9. The measurement system of claim 8, wherein the at least one additional wire is non-shielded.

10. The measurement system of claim 7, further comprising at least one common wire within the additional shielding.

11. The measurement system of claim 1, wherein the shielding is configured to reduce capacitive current flowing through the first and second wires.

12. The measurement system of claim 1, wherein the x-ray tube comprises a mono-polar x-ray tube.

13. The measurement system of claim 1, wherein the x-ray tube comprises a bi-polar x-ray tube.

14. The measurement system of claim 1, wherein the voltage source comprises a high voltage tank and the measurement resistor is located within the high voltage tank.

15. A measurement system comprising:
    at least one wire connected to an electrode of an x-ray tube from which an electron beam is emitted, the at least one wire surrounded by shielding, wherein the shielding is at a voltage level different from ground level;
    a current measurement device connected between the at least one wire and the shielding; and additional shielding surrounding the shielding of the a least one wire.

16. The measurement system of claim 15, wherein the electrode is a cathode and the at least one wire is a cathode current supply wire.

17. The measurement system of claim 15, wherein the current measurement device is a resistor.

18. The measurement system of claim 15, wherein the current measurement device comprises one of an inductive member or a Hall sensor.

19. The measurement system of claim 15, further comprising a high voltage tank supplying power to the x-ray tube and the current measurement device is located within the high voltage tank.

20. An x-ray system comprising:
a gantry;
an x-ray tube mounted to the gantry, the x-ray tube including a filament;
a high voltage tank coupled to the x-ray tube, the high voltage tank configured to power the x-ray tube;
a detector mounted to the gantry opposite the x-ray tube assembly;
a current measurement system including a first wire within shielding, the first wire connected between the high voltage tank and the filament of the x-ray tube, a second wire within shielding, the second wire connected between the high voltage tank and the x-ray tube, and a measurement resistor at a high voltage potential within the voltage tank, the measurement resistor connected between the shielding and one of the first or second wires; and
additional shielding surrounding the shielding of the first and second wires.

* * * * *